United States Patent [19]

Morimoto et al.

[11] Patent Number: 5,077,762
[45] Date of Patent: Dec. 31, 1991

[54] CHARGE TRANSFER DEVICE HAVING MIM STRUCTURES AND METHOD FOR DRIVING THE SAME

[75] Inventors: Masamichi Morimoto; Hiroshi Nakano; Yoshiyuki Mimura, all of Hachioji, Japan

[73] Assignee: Olympus Optical Co., Ltd., Tokyo, Japan

[21] Appl. No.: 584,355

[22] Filed: Sep. 18, 1990

[30] Foreign Application Priority Data

Sep. 25, 1989 [JP] Japan ................................ 1-246265

[51] Int. Cl.$^5$ ..................... H01L 29/78; G11C 19/28
[52] U.S. Cl. .................................. 377/57; 377/60; 377/61; 357/4; 357/24; 365/183
[58] Field of Search ..................... 377/57, 60, 61–64, 377/67; 357/4, 6, 8, 24, 51; 365/175, 106, 183, 182, 149

[56] References Cited
U.S. PATENT DOCUMENTS

| | | | |
|---|---|---|---|
| 3,986,176 | 10/1976 | Weimer | 377/62 |
| 4,177,391 | 12/1979 | Sunami et al. | 377/63 |
| 4,534,015 | 8/1985 | Wilson | 365/107 |
| 4,648,072 | 3/1987 | Hayes et al. | 377/57 |
| 4,813,016 | 3/1989 | Okada et al. | 357/6 |
| 4,910,293 | 3/1990 | Uekita et al. | 264/216 |
| 4,939,556 | 7/1990 | Eguchi et al. | 357/4 |
| 4,972,370 | 11/1990 | Morimoto et al. | 357/6 |

Primary Examiner—Stanley D. Miller
Assistant Examiner—Tai V. Duong
Attorney, Agent, or Firm—Frishauf, Holtz, Goodman & Woodward

[57] ABSTRACT

There is provided a one-dimensional MIM array having MIM structures arranged on an insulative substrate in a lateral direction and each used as a unit for storing a signal charge, for sequentially storing and transferring the signal charges between the adjacent MIM structures. With the above element structure, the signal charge is transferred in each of the MIM structures in a thickness direction (depth direction) thereof and stored in a capacitor. The signal charge stored in the capacitor is sequentially transferred in a lateral direction or to the next MIM structure. In order to drive the above charge transfer device, transfer pulses applied to a plurality of MIM structures constituting a one-dimensional MIM array are controlled to sequentially transfer and store the signal charges into the MIM structures starting from the MIM structure which is provided on the output terminal side of the one-dimensional MIM array. At the time of reading out the signal charge, signal charges are sequentially read out and transferred from the MIM structures starting from the MIM structure which is provided on the output terminal side.

14 Claims, 11 Drawing Sheets

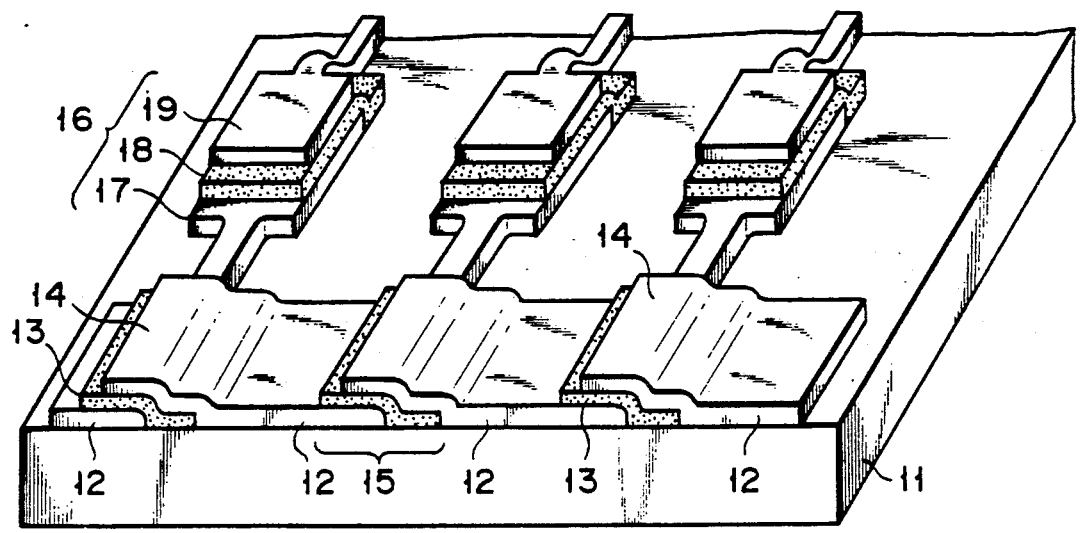
F I G. 1
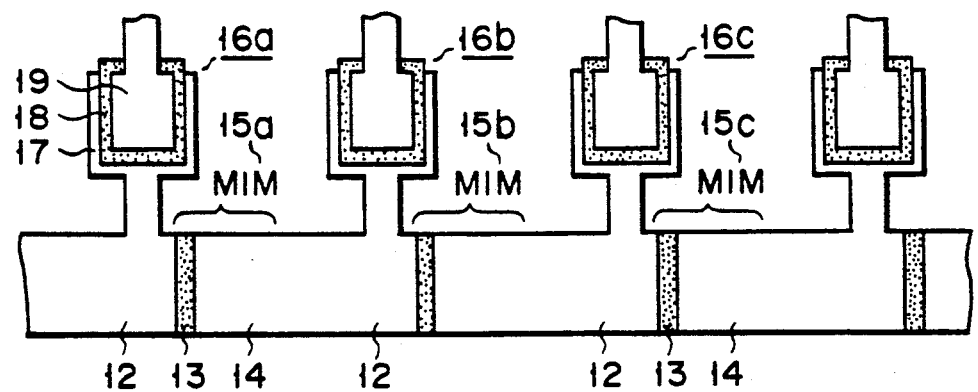
F I G. 2

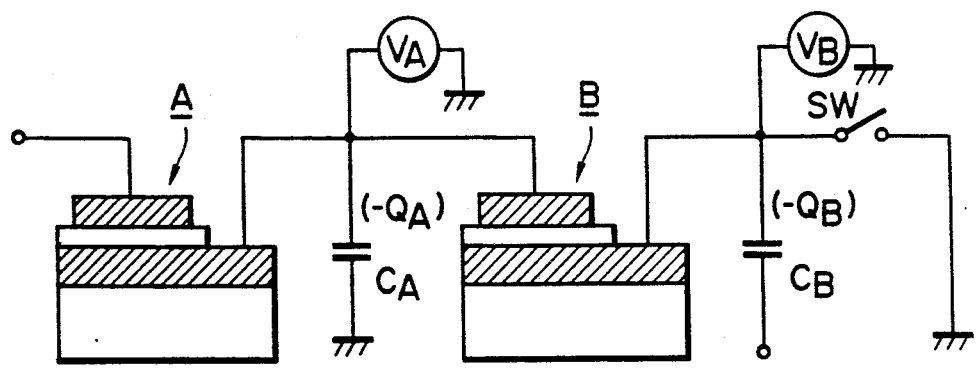
F I G. 9
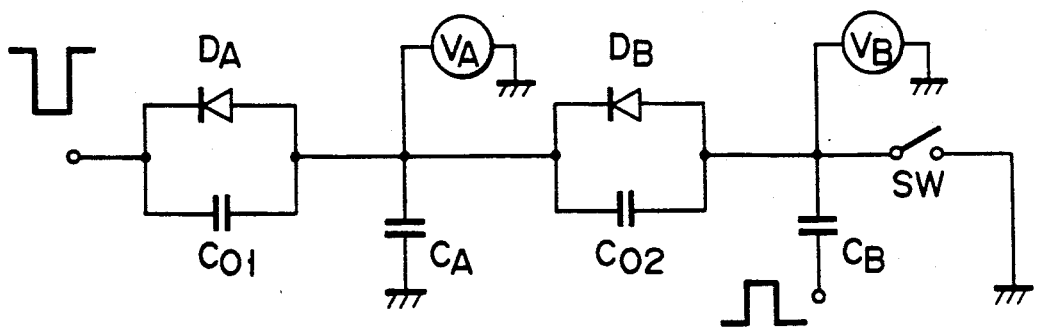
F I G. 10
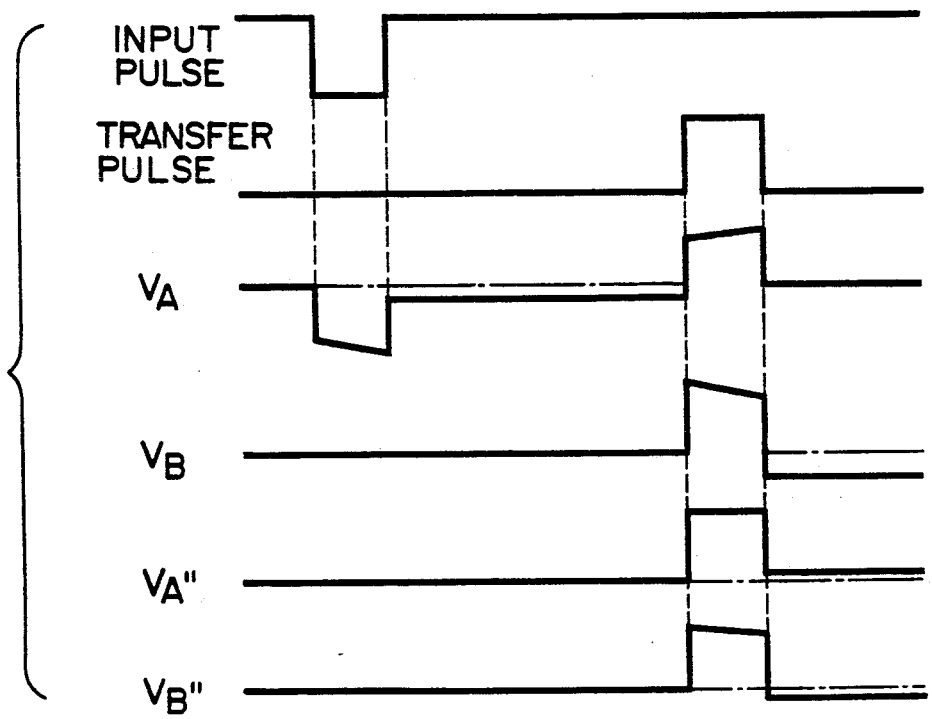
F I G. 11

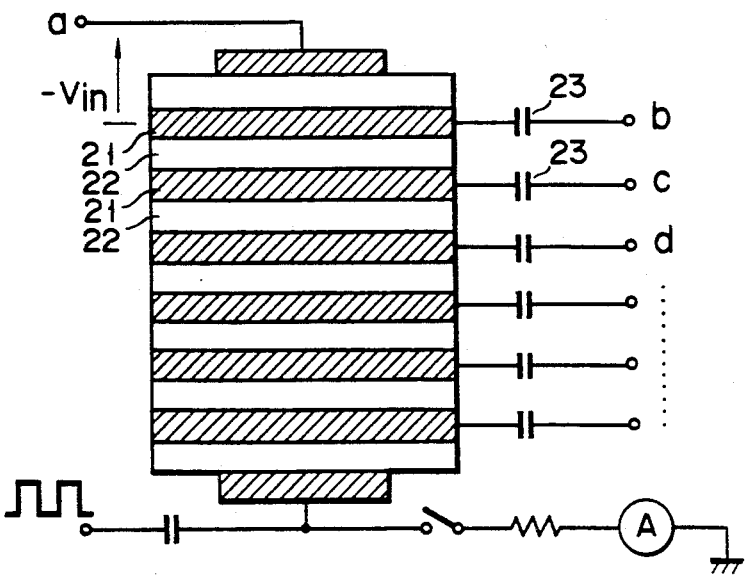
F I G. 15
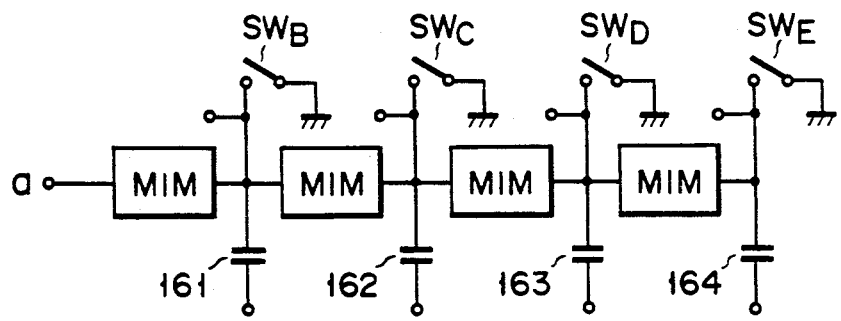
F I G. 16
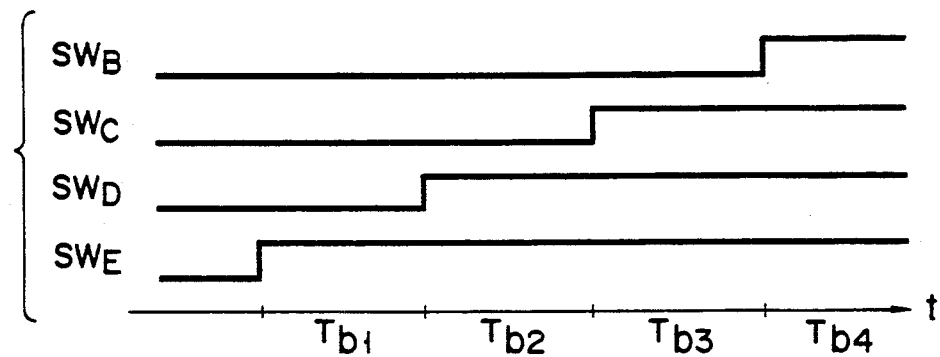
F I G. 17

CHARGE TRANSFER DEVICE HAVING MIM STRUCTURES AND METHOD FOR DRIVING THE SAME

BACKGROUND OF THE INVENTION

1. Field of the Invention

This invention relates to a charge transfer device having MIM structures each formed by sandwiching a tunnel switching film between metal films as a basic unit for charge storage and to a method for driving the charge transfer device.

2. Description of the Related Art

As a typical charge transfer device, a charge coupled device (CCD) is known. The CCD has a basic function of sequentially transferring charges stored in a potential well to a next stage potential well by controlling the depth of the potential wells.

Such a CCD has an element structure in which boron implanted layers are formed by diffusion in a p-Si substrate to form a potential barrier and electrodes for forming potential wells are formed on an SiO$_2$ film for forming a capacitor, for example. The CCD having the above element structure functions to transfer charges in a lateral direction with respect to the substrate when receiving 2-phase clock signals having a potential difference at the electrodes. The CCD has received much attention as a high density memory which can be formed with a density as high as or higher than a DRAM.

However, when such an element structure is provided on a normal semiconductor Si substrate or amorphous Si substrate, it is generally necessary to effect a high-temperature process at or higher than 500° C. Therefore, formation of the multi-layer structure may provide difficult problems and it is generally considered possible to obtain a laminated structure of two or three layers at most.

The inventors of this invention proposed a charge transfer device of an element structure having a laminated structure of alternately laminated tunnel switching films and metal films and having capacitors connected to the metal films as is disclosed in a U.S. patent application Ser. No. 07/398,271, now U.S. Pat. No. 4,972,370, for example. The charge transfer device has a multi-layered basic structure which is an MIM structure formed by alternately laminating the tunnel switching films (I) formed of organic material and metal films (M) and metal electrodes formed on the top and bottom of the structure. Further, capacitors are connected to the metal films.

With the charge transfer device of the above structure, an input voltage higher than a preset threshold voltage $V_{th}$ is applied to the metal electrode on the top portion to store charges on the first capacitor. Then, the charges stored on the first capacitor are sequentially transferred in the thickness (depth) direction of the structure by applying a plurality of transfer pulses having a preset phase difference to the MIM structure via the capacitors connected to the respective metal films. That is, the operation of transferring the charges utilizes a 2- or 3-phase driving system using two or three charge storing sections for storing and transferring each information charge.

According to this charge transfer system, a plurality of information charges can be transferred at the same time, but it is necessary to use a large number of charge storing sections and increase the number of necessary layers since two or three charge storing sections are used for storing and transferring each information charge. Therefore, it is extremely disadvantageous in a case where the information charges are stored at a high density.

SUMMARY OF THE INVENTION

An object of this invention is to provide a charge transfer device having a highly practical element structure using an MIM structure which can be easily formed by a low-temperature process and can easily attain a high density.

Another object of this invention is to provide a method for driving a highly practical charge transfer device capable of storing and transferring information charges at a high density.

According to one aspect of this invention, there is provided a charge transfer device comprising: a substrate having an insulative surface; and a first one-dimensional MIM array formed on the surface of the substrate, wherein the first one-dimensional MIM array includes: (a) a plurality of MIM structures arranged on a row, each of the MIM structures being formed of a tunnel switching film held between first and second metal films and the first metal film of each of the MIM structures being electrically connected to the second metal film of a next stage MIM structure which is adjacent to the former MIM structure; and (b) capacitors respectively connected to the first metal films of the respective MIM structures.

According to another aspect of this invention, there is provided a method for driving a charge transfer device, the charge transfer device comprising a substrate having an insulative surface; and a one-dimensional MIM array formed on the surface of the substrate, wherein the one-dimensional MIM array includes: (a) a plurality of MIM structures arranged on a row, each of the MIM structures being formed of a tunnel switching film held between first and second metal films and the first metal film of each of the MIM structures being electrically connected to the second metal film of a next stage MIM structure which is adjacent to the former MIM structure; and (b) capacitors respectively connected to the first metal films of the respective MIM structures, and the one-dimensional MIM array stores signal charges supplied to the second metal film of a corresponding one of the MIM structures into the capacitor in response to a transfer pulse applied to the MIM structure via the capacitor, the method comprising the steps of: controlling the time widths of transfer pulses respectively applied to the plurality of MIM structures constituting the one-dimensional MIM array in order to selectively control the MIM structures for serially transferring the signal charges; and serially transferring the signal charges between the MIM structures which are applied with the transfer pulses by respectively applying the transfer pulses whose time widths are controlled to the plurality of MIM structures constituting the one-dimensional MIM array.

According to still another aspect of this invention, there is provided a method for driving a charge transfer device, the charge transfer device comprising a substrate having an insulative surface; and a one-dimensional MIM array formed on the surface of the substrate, wherein the one-dimensional MIM array includes (a) a plurality of multi-layered MIM structures arranged on a row, each of the MIM structures being formed by alternately laminating a plurality of metal films and a plurality of tunnel switching films and using the tunnel switching film held between the adjacent metal films as a basic unit; and (b) capacitors respectively connected to the metal films of the respective MIM structures, the method comprising the steps of: sequentially storing signal charges supplied from the input terminal of the one-dimensional MIM array into the capacitors starting from the capacitor which is connected to the MIM structure provided on the output terminal side thereof; and sequentially reading out the signal charges from the capacitors starting from the capacitor which is connected to the MIM structure provided on the output terminal side of the one-dimensional MIM array.

In the charge transfer device of this invention, the MIM structures used as units of signal charge storage are laterally arranged on the insulative substrate to constitute a one-dimensional MIM array in which the signal charge is sequentially stored and transferred between the adjacent MIM structures. With the above element structure, the charge is transferred and stored in the thickness (depth) direction of the individual MIM structures but the stored signal charge is sequentially transferred in the lateral direction thereof. Therefore, in a case where the number of MIM structures is increased to increase the number of charge transfer/storage sections thereof, a charge transfer device having a multi-stage charge transfer/storage section can be obtained without increasing the number of laminated layers and with substantially the same number of laminated layers as the MIM structure. Thus, the element structure can be easily obtained by using a low-temperature process without using a high-temperature process.

Further, in the operation of driving the charge transfer device, the signal charge is sequentially transferred and stored into the MIM structures starting from the MIM structure provided on the output side by controlling the transfer clocks which are applied to the MIM structures constituting the one-dimensional array, and the signal charges are sequentially read out and transferred from the MIM structures starting from the MIM structure provided on the output side in the signal charge reading mode. Therefore, the signal charges can be stored at a high density by effectively using the plurality of MIM structures constituting the one-dimensional array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view schematically showing the element structure of a charge transfer/storage section of a charge transfer device according to one embodiment of this invention;

FIG. 2 is a plan view of the charge transfer/storage section of FIG. 1;

FIG. 9 is a diagram showing the construction of a two-stage type experimental circuit for determining the operation of the charge transfer device of FIG. 3;

FIG. 10 is a circuit diagram showing an electrical equivalent circuit of the experimental circuit of FIG. 9;

FIG. 11 is a signal waveform diagram showing the charge transferring operation in the experimental circuit of FIG. 9;

FIG. 15 is a diagram showing a vertical transfer type MIM array to which a driving method of this invention is applied;

FIG. 16 is a diagram showing the serial-parallel conversion operation in a one-dimensional MIM array;

FIG. 17 is a timing chart showing the operation timing for the serial-parallel conversion;

DETAILED DESCRIPTION OF THE PREFERRED EMBODIMENTS

Figure 3:
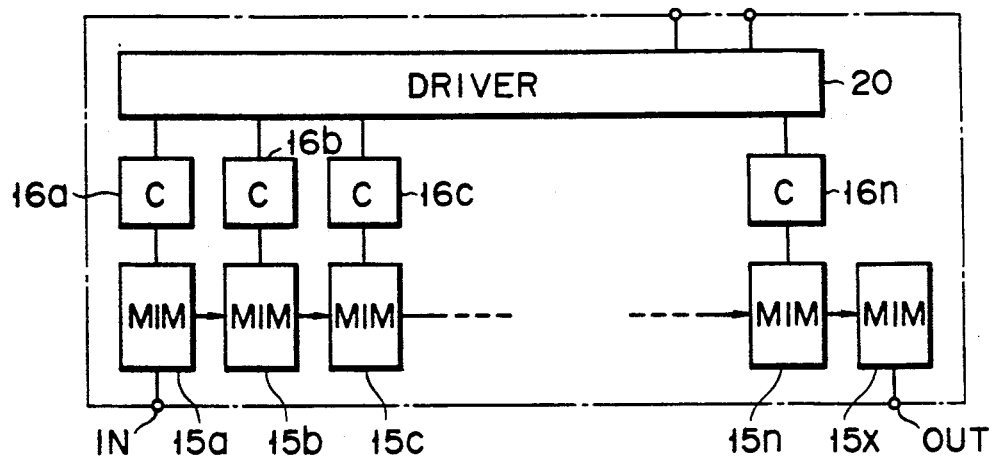
FIG. 3 is a block diagram showing the construction of a charge transfer device including the charge transfer/storage section of FIG. 1.

As shown in FIGS. 1 and 2, the charge transfer/storage section of a charge transfer device according to one embodiment of this invention includes a plurality of series-connected MIM structures 15 (15a, 15b, 15c, ... ) laterally arranged on an insulative substrate (or a substrate coated with an insulative film) 11. The MIM structures 15 are formed as described below. That is, first metal films 12 are arranged at a regular interval on a row on the substrate 11 and then LB films (ultra-thin organic films formed by the Langmuir-Blodgett method) are disposed as tunnel switching films 13 on the right portions thereof, for example. After this, second metal films 14 are disposed on the respective tunnel switching films 13 to be electrically connected to the left portions of the adjacent first metal films 12, respectively. Thus, a plurality of MIM structures 15 which are each constituted by the first and second metal films 12 and 14 and the tunnel switching film 13 disposed therebetween are formed.

Further, the first metal films 12 which constitute the plurality of MIM structures 15a to 15n are formed to extend in a direction perpendicular to the direction of arrangement of the MIM structures 15a, 15b, 15c, ... and respectively connected to capacitors 16 (16a, 16b, 16c, ...) which are formed for the respective MIM structures 15a, 15b, 15c, ... The capacitors 16a, 16b, 16c, ... are formed to have the first metal films 12 constituting the MIM structures 15a, 15b, 15c, ... as lower electrodes 17 and upper electrodes 19 disposed on a dielectric film 18 which is formed on the lower electrodes.

That is, with the element structure of the charge transfer/storage section of the charge transfer device according to this invention, each MIM structure 15 having the tunnel switching film 13 disposed between the first and second metal films 12 and 14 is connected to the capacitor 16 to constitute a unit cell as a memory and the unit cells are arranged on the insulative substrate 11 and serially connected to constitute a one-dimensional array.

FIG. 3 is a diagram showing the block construction of the charge transfer device having the element structure of the charge transfer/storage section. A driving circuit 20 supplies transfer pulses to the MIM structures 15a to 15n via the capacitors 16a to 16n so as to permit a signal charge supplied from the input terminal IN to be serially transferred between the MIM structures 15a to 15n which are arranged in a one-dimensional form. An MIM structure 15x arranged on the side of the output terminal OUT functions as a switching element for reading the signal charge from the one-dimensional MIM array formed of the MIM structures 15a to 15n.

Thus, the charge transfer device having the charge transfer/storage section having a plurality of MIM structures 15a to 15n laterally arranged on the insulative substrate 11 to constitute the one-dimensional MIM array transfers charges in the depth direction (the thickness direction of the substrate 11) in the MIM structures 15a to 15n and stores the charges in the respective capacitors 16a to 16n. The stored charges are sequentially transferred laterally to the adjacent ones of the MIM structures 15a to 15n by repeatedly effecting the above operation.

Further, the element structure can be realized as a three-layered element basically having the first and second metal films 12 and 14 and the tunnel switching film 13 disposed between the films 12 and 14 which constitute the unit cell. As a result, the element structure can be easily realized by using only the multi-layer wiring technique by a conventional low-temperature process without using the multi-layer technique by a high-temperature process.

Next, the method of driving the charge transfer device having the above construction is explained.

Figure 4:
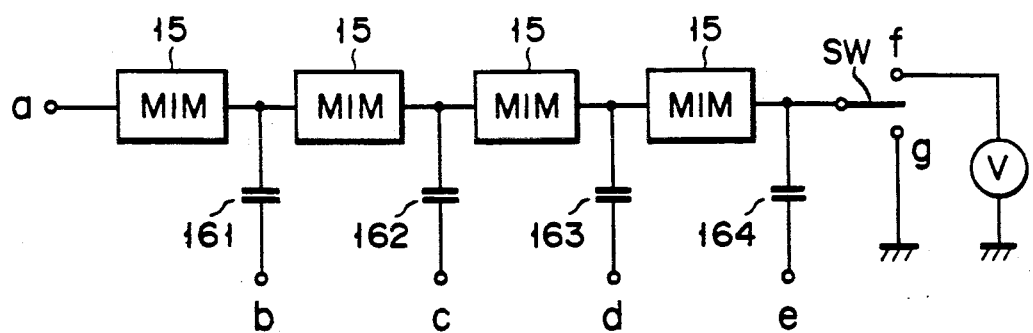
FIG. 4 is a circuit diagram showing an equivalent circuit of the charge transfer device of FIG. 3.

FIG. 4 shows an electrical equivalent circuit of the charge transfer device having the above construction and shows a one-dimensional MIM array having four-stage unit cells serially connected. That is, each of four serially connected MIM structures 151, 152, 153 and 154 constitutes a unit cell as a memory element together with a corresponding one of capacitors 161, 162, 163 and 164. The four MIM structures 151, 152, 153 and 154 are driven in response to transfer pulses supplied via the capacitors 161, 162, 163 and 164.

Figure 5:
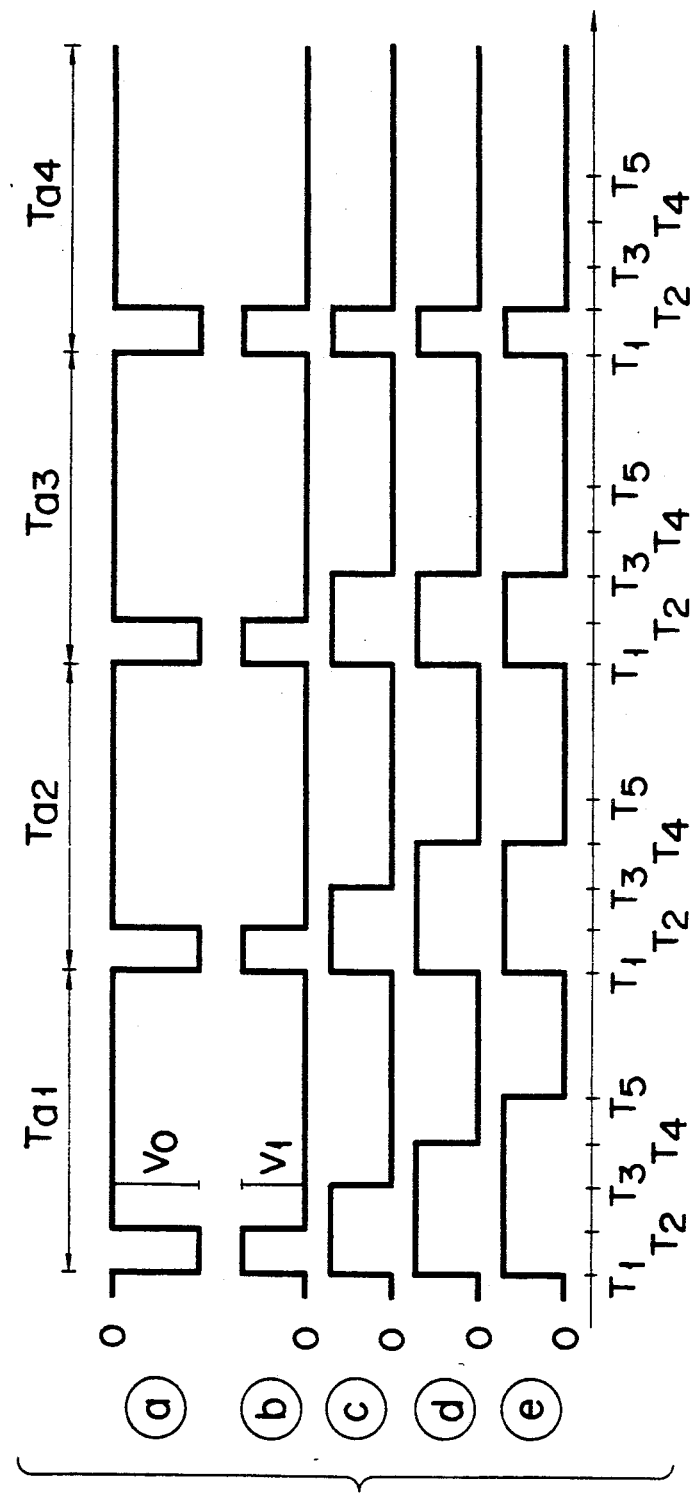
FIG. 5 is a drive timing chart showing the operation of transferring and storing the signal charge in respective points in the circuit of FIG. 4.
Figure 6:
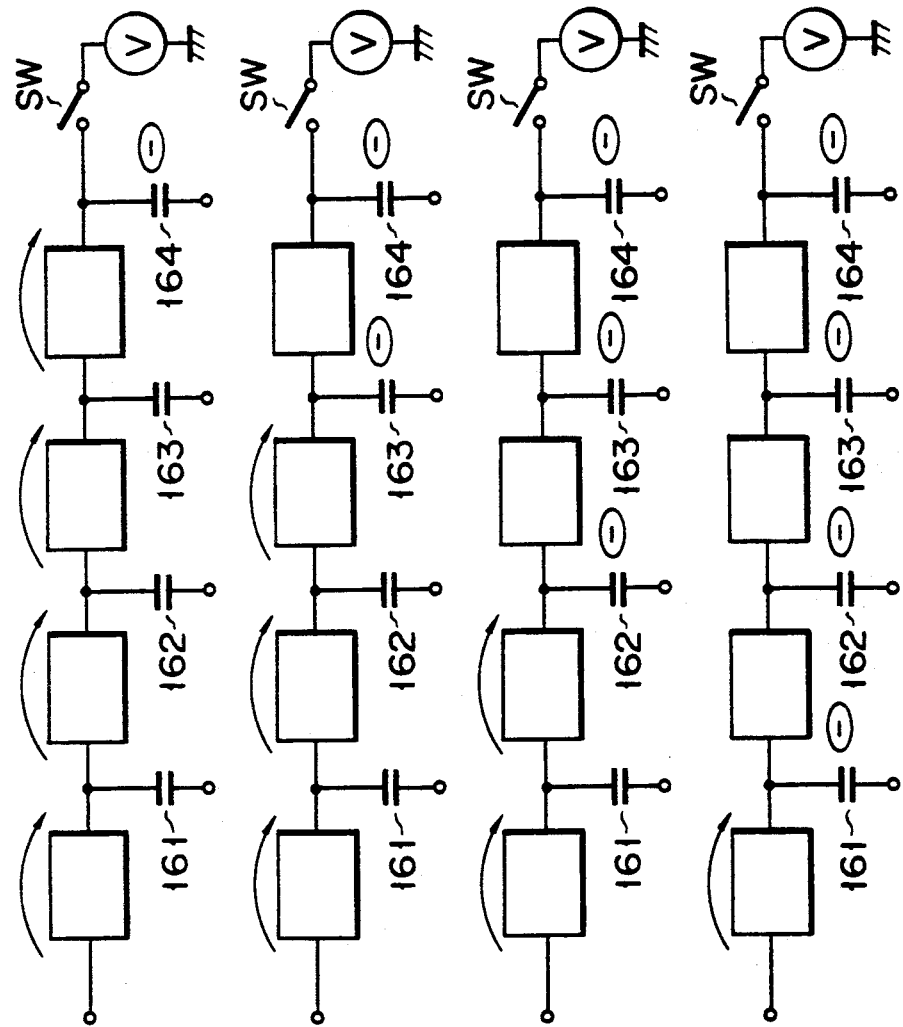
FIGS. 6A to 6D are diagrams schematically showing the operation of transferring and storing the signal charge in the charge transfer device of FIG. 4.

The operation of inputting a signal charge to the one-dimensional MIM array is effected by applying a negative voltage $V_0$ to an input terminal a connected to the leftmost MIM structure 151. As shown in FIG. 5, transfer pulses (positive voltage $V_1$) having different time widths are applied to respective terminals b, c, d and e of the capacitors 161, 162, 163 and 164 in synchronism with the signal voltage $V_0$ to the input terminal a. As a result, charges corresponding to the input voltage $V_0$ are sequentially transferred and stored into the capacitors 161, 162, 163 and 164.

That is, in the first signal charge inputting period $T_{a1}$, transfer pulses (positive voltage $V_1$) are applied to the respective terminals b, c, d and e of the capacitors 161, 162, 163 and 164 in synchronism with application of the signal voltage $V_0$ to the input terminal a for a period (period from $T_1$ to $T_2$) during which the signal voltage $V_0$ is applied. Then, a preset bias voltage $(V_0+V_1)$ is applied to the tunnel switching film of the first-stage MIM structure 151 by the voltages to make the tunnel switching film conductive. Conduction of the tunnel switching film permits negative charges corresponding to the input voltage $V_0$ to be stored in the capacitor 161. In this period ($T_1$ to $T_2$), the same potentials are applied to the both ends of the second-to fourth-stage MIM structures 152, 153 and 154 so that each tunnel switching film will not be made conductive.

In the next timing (period from $T_2$ to $T_3$), as shown in FIG. 5, a transfer pulse for the first-stage MIM structure disappears and transfer pulses (positive voltage $V_1$) are applied only to the second- to fourth-stage MIM structures 152, 153 and 154. As a result, since a bias voltage is applied between the capacitor 161 in which the signal charge is stored and the second-stage MIM structure 152, the tunnel switching film of the second-stage MIM structure 152 is made conductive. Then, conduction of the tunnel switching film causes the negative charges to be transferred to the second-stage capacitor 162.

After this, in the next timing (period from $T_3$ to $T_4$), a transfer pulse for the second-stage MIM structure 152 is removed and transfer pulses (positive voltage $V_1$) are applied only to the third- and fourth-stage MIM structures 153 and 154. As a result, since a bias voltage is applied between the capacitor 162 in which the signal charge is stored and the third-stage MIM structure 165, the tunnel switching film of the third-stage MIM structure 153 is made conductive, causing the negative charge stored in the capacitor 162 to be transferred to the third-stage capacitor 163.

After this, in the next timing (period from $T_4$ to $T_5$), a transfer pulse for the third-stage MIM structure 153 is removed and a transfer pulse (positive voltage $V_1$) is applied only to the fourth-stage MIM structure 15, and as a result, the tunnel switching film of the fourth-stage MIM structure 154 is made conductive, causing the negative charge stored in the capacitor 163 to be transferred to the fourth-stage capacitor 164.

After this, in the next signal charge inputting period $T_{a2}$, transfer pulses (positive voltage $V_1$) are applied to the respective terminals b, c, d and e of capacitors 161, 162, 163 and 164 (period from $T_1$ to $T_2$) in synchronism with application of the signal voltage $V_0$ to the input terminal a, and then negative charges corresponding to the input voltage $V_0$ are stored into the first-stage MIM structure 151. Then, in the same manner as described above, transfer pulses starting from a transfer pulse applied to the first-stage MIM structure 151 are sequentially removed to sequentially transfer the signal charge to the third-stage capacitor 163, and at this time, the transfer pulse applied to the fourth-stage MIM structure 154 is also removed. As a result, the negative charge transferred to the third-stage capacitor 163 is kept stored in the third-stage capacitor 163 without being transferred to the fourth-stage capacitor 164.

Then, as shown in FIG. 5, in the next signal charge inputting period $T_{a3}$, transfer pulses applied to the third- and fourth-stage MIM structures 153 and 154 are removed when the signal charge is transferred to the second-stage capacitor 162 so as to keep the signal charge stored in the second-stage capacitor 162.

Then, in the next signal charge inputting period $T_{a4}$, transfer pulses applied to the MIM structures 151, 152, 153 and 154 are removed when the signal charge is stored to the first-stage capacitor 161 so as to keep the signal charge stored in the first-stage capacitor 161.

As shown in FIGS. 6A to 6D schematically illustrating the process of transferring and storing the signal charge, each time the signal charge is input from the input terminal a by controlling the time widths of the transfer pulses applied to the MIM structures 151, 152, 153 and 154, the signal is sequentially stored into the capacitors starting from the final-stage capacitor or from the rightmost capacitor in this example by controlling the transfer of the signal charge between a plurality of serially connected MIM structures.

The operation of reading the signal charges stored in the capacitors 161, 162, 163 and 164 is effected as follows.

The signal charge reading operation is effected by setting a switch SW connected to the final-stage capacitor 164 shown in FIG. 4 on the side of the terminal f and measuring the signal charge stored in the capacitor 164 by means of a voltmeter V. Further, the switch SW has a function of grounding the capacitor 164 via a terminal g to erase the signal charge thereof. The switching control of the switch SW and the transfer pulse control are effected to transfer the signal charge stored in the capacitor of each stage to the final-stage capacitor 164. Then, the signal charge is measured by the voltmeter V to read out the signal charge.

Figure 7:
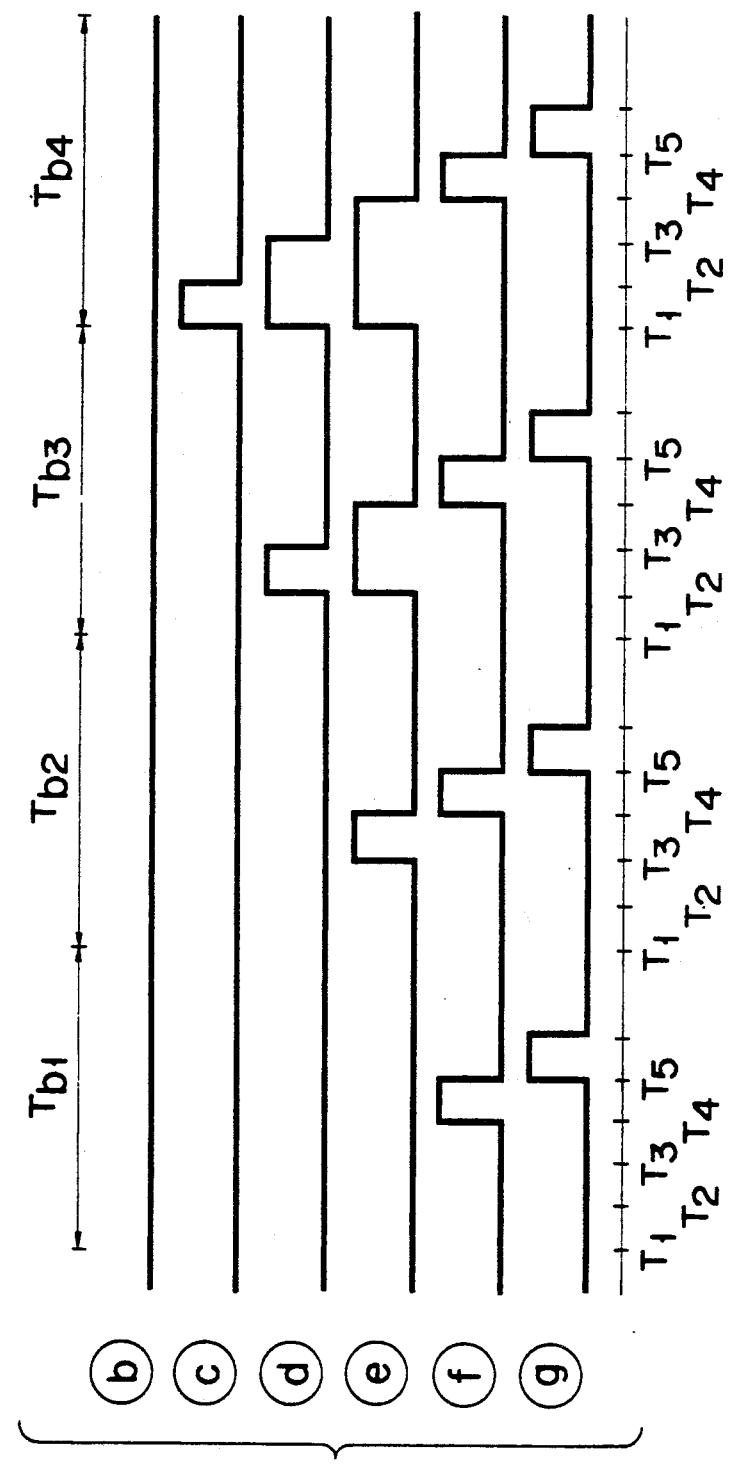
FIG. 7 is a drive timing chart showing the operation of transferring and reading the signal charge in respective points in the circuit of FIG. 4.
Figure 8:
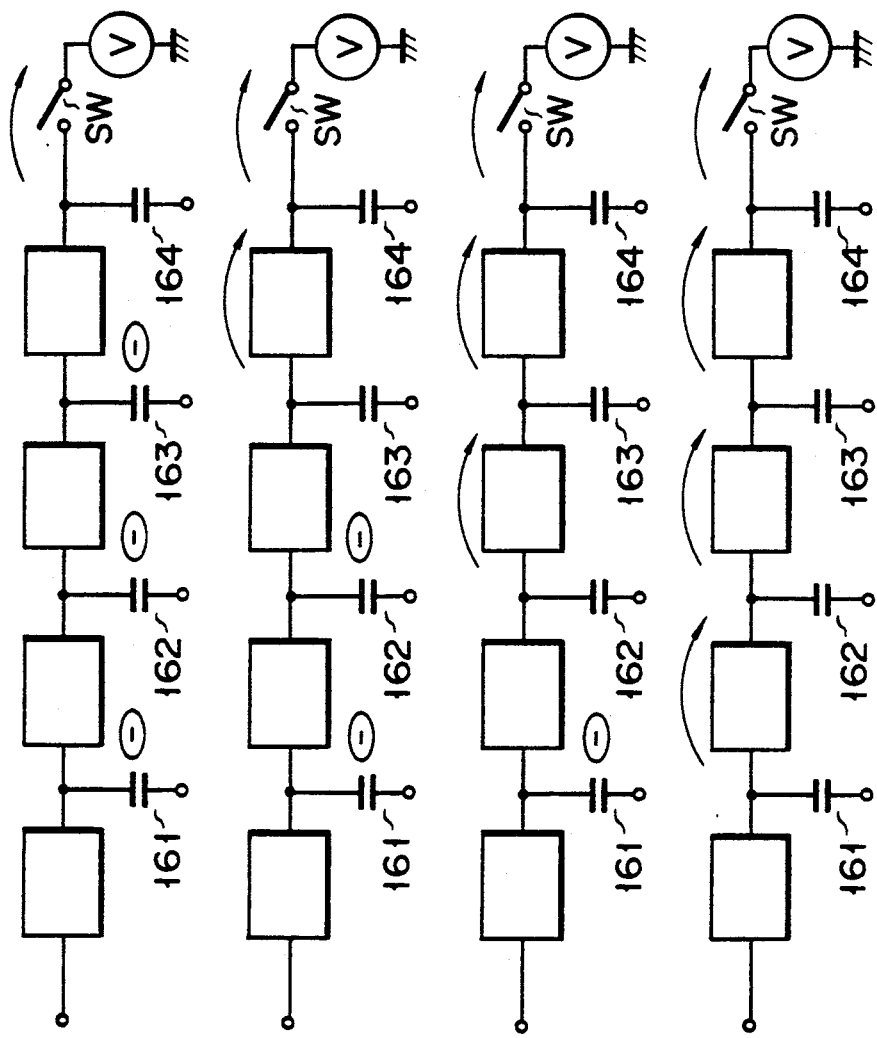
FIGS. 8A to 8D are diagrams schematically showing the operation of transferring and reading the signal charge in the charge transfer device of FIG. 4.

More specifically, as shown in FIG. 7 illustrating the operation timing, the operation of reading out the signal charge stored in the capacitor 164 is effected by connecting the switch SW to the voltmeter V (on the side of the terminal f) and measuring the signal charge. Then, the switch SW is set on the grounded side (on the side of the terminal g) to erase the signal charge stored in the capacitor 164 (period $T_{b1}$).

After this, when the operation of reading out the signal charge stored in the capacitor 163 is effected (period $T_{b2}$), a transfer pulse is first applied to the fourth-stage MIM structure 154 via the capacitor 164 to apply a preset bias voltage to the fourth-stage MIM structure 154 so that the tunnel switching film thereof can be made conductive. Then, the signal charge stored in the third-stage capacitor 163 is transferred to the fourth-stage capacitor 164 which has been previously reset. In this condition, the signal charge is read out by measuring the signal charge transferred and stored in the fourth-stage capacitor 164 by means of the voltmeter V. After this, the capacitor 164 is reset as described before and the condition is set for the next signal charge reading operation.

After this, when the operation of reading out the signal charge stored in the capacitor 162 is effected (period $T_{b3}$), transfer pulses are applied to the third-and fourth-stage MIM structures 153 and 154 as shown in FIG. 7 to make the tunnel switching film of the third-stage MIM structure 153 conductive so that the signal charge stored in the second-stage capacitor 162 can be transferred to the third-stage capacitor 163. Then, a transfer pulse is applied only to the fourth-stage MIM structure 154 to make the tunnel switching film of the fourth-stage MIM structure 154 conductive so that the signal charge stored in the third-stage capacitor 163 can be transferred to the fourth-stage capacitor 164. The signal charge transferred and stored in the fourth-stage capacitor 164 is read out by measuring the signal charge by means of the voltmeter V as described before and the reading operation is completed.

Likewise, the signal charge stored in the first-stage capacitor 161 is read out by transferring the same to the fourth-stage capacitor 164 by effecting the above described transfer pulse controlling operation (period $T_{b4}$).

That is, as shown in FIGS. 8A to 8D schematically showing the process of transferring and reading the signal charge, in order to sequentially read out the signal charges stored in the capacitors 161, 162, 163 and 164, each time the signal charge stored in the final-stage capacitor 164 is read out the next signal charge is serially transferred to the final-stage capacitor 164. In this way, the signal charges stored in the respective capacitors 161, 162, 163 and 164 are read out from the final stage capacitor.

The inventors of this invention confirmed by experiment that the charge transfer device with the above construction is correctly operated and the driving method therefor is correctly effected.

FIG. 9 shows an experimental device of two-stage memory structure constituted by two MIM structures A and B and two capacitors $C_A$ and $C_B$. The capacitors $C_A$ and $C_B$ are connected to a voltmeter of high impedance and are so constructed that the storage charge amounts $Q_A$ and $Q_B$ thereof can be monitored as voltages $V_A$ and $V_B$. Further, the switch SW is a switch for resetting the capacitor $C_B$. In the experimental circuit, the first-stage MIM structure A is made conductive only by application of an input pulse so as to permit charges for the first-stage capacitor $C_A$ to be input. Further, application of a transfer pulse to the second-stage MIM structure B causes the stored charge to be transferred to the second-stage capacitor $C_B$.

Thus, this experimental circuit is constructed in an equivalent form as shown in FIG. 10 and the MIM structures A and B are represented by diode switches $D_A$ and $D_B$ and parasitic capacitors $C_{01}$ and $C_{02}$ which are connected in parallel with the diode switches. The capacitances of the parasitic capacitors $C_{01}$ and $C_{02}$ are extremely small in comparison with those of the capacitors $C_A$ and $C_B$.

Assuming now that a parasitic voltage occurring in the MIM structure is V', then the voltage of the capacitor CA measured by the voltmeter can be expressed by the following equation. That is, $$V_A = (Q_A/C_A).$$

From the above equation, it is understood that there is a proportional relation between the stored charge amount $Q_A$ and the detection voltage $V_A$ when the parasitic voltage V' can be neglected as 0. This is true for the relation between the stored charge amount $Q_B$ and the detected voltage $V_B$ in the capacitor $C_B$.

When a preset negative voltage pulse is applied as an input pulse to the first-stage MIM structure A as shown in FIG. 11, the tunnel switching film (diode $D_A$) of the MIM structure A is biased in a forward direction, causing a negative potential to occur at the terminal of the capacitor $C_A$. After this, when the above negative voltage pulse is removed, a certain negative voltage remains on the capacitor $C_A$. This indicates that a negative charge is input to the capacitor $C_A$.

After this, when a transfer pulse is applied via the second-stage capacitor $C_B$ as shown in FIG. 11, the transfer pulse voltage is applied to the first-stage capacitor $C_A$ via the second-stage MIM structure B. Then, when the transfer pulse has disappeared, the potential of the first-stage capacitor $C_A$ is returned to 0. At this time, the potential $V_B$ of the second-stage capacitor $C_B$ is raised to the potential level of the transfer pulse at the time of application of the transfer pulse and then becomes stable at a negative constant voltage. Further, the negative voltage $V_B$ is substantially equal to the potential $V_A$ set when the charge is stored in the first-stage capacitor $C_A$.

This means that the charge corresponding to the input pulse potential is stored in the first-stage capacitor $C_A$ as a negative charge and then the charge is transferred and stored in the second-stage capacitor $C_B$ in response to the input of the transfer pulse. Occurrence of variation in the potentials of the capacitors $C_A$ and at $C_B$ the time of application of the input pulse and the transfer pulse (or occurrence of inclination of the potential variation) means that the charge is transferred.

Further, when only a transfer pulse is applied to the second-stage MIM structure B in a case where no input pulse is applied or the potential of the capacitor $C_A$ is 0, the potential variation occurs in response to application of the transfer pulse as shown by voltages $V_A''$ and $V_B''$ in FIG. 11, but the potential after removal of the transfer pulse will become substantially 0. This means that the charge will not be stored into the capacitor $C_A$ and the charge will not be transferred when the charge is not input by an input pulse.

The result of the experiment shows that a plurality of serially connected MIM structures can be selectively made conductive by controlling the potential applied to the MIM structures and the input charge can be sequentially transferred.

Figure 12:
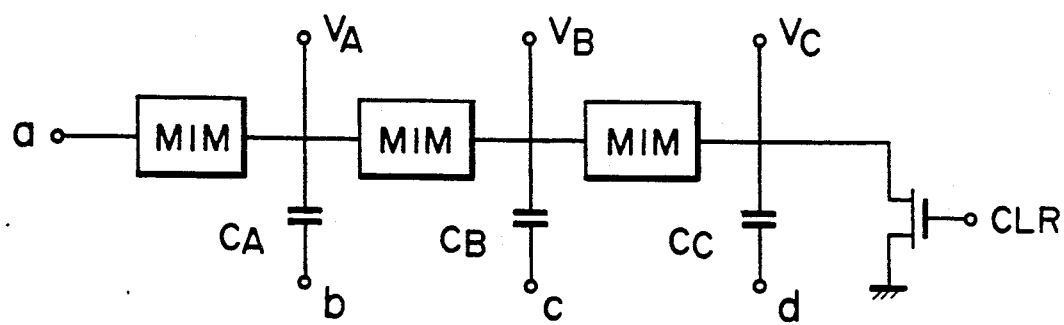
FIG. 12 is a diagram showing the construction of a three-stage type experimental circuit.

In FIG. 12, an experimental circuit having three MIM structures serially connected is shown. In the experimental circuit, capacitors $C_A$, $C_B$ and $C_C$ are connected to the respective MIM structures and transfer pulses are applied to the respective MIM structures via the capacitors $C_A$, $C_B$ and $C_C$. The potentials $V_A$, $V_B$ and $V_C$ of the capacitors $C_A$, $C_B$ and $C_C$ are monitored by use of a voltmeter.

Figure 13:
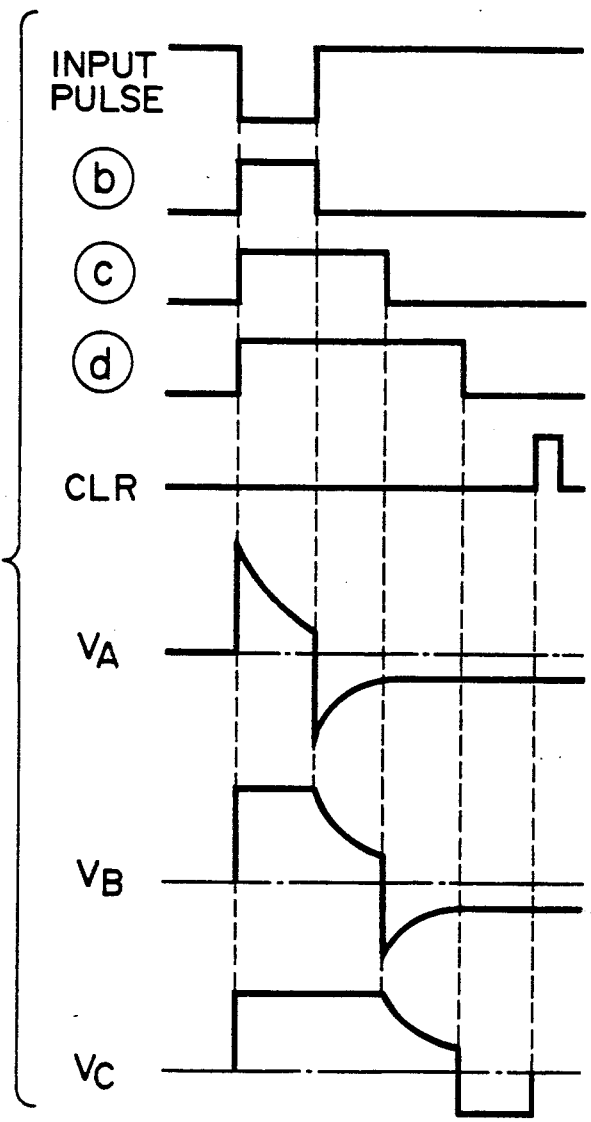
FIGS. 13 and 14 are signal waveforms showing the experimental results of the experimental circuit of FIG. 12.

In the three-stage experimental circuit of the above construction, when transfer pulses having different time widths are applied to the MIM structures in synchronism with a negative voltage pulse while the negative voltage pulse is applied as shown in FIG. 13, for example, the potentials $V_A$, $V_B$ and $V_C$ of the capacitors $C_A$, $C_B$ and $C_C$ vary as shown in FIG. 13.

That is, the potential $V_A$ of the first-stage capacitor is raised to a bias voltage level in response to application of the transfer pulse and is lowered when the charge is transferred from the input terminal to the capacitor $C_A$. When the transfer pulse to the first-stage MIM structure has disappeared, the potential is lowered by an amount corresponding to the bias voltage.

Under this condition, a transfer pulse is still applied to the second-stage MIM structure. As a result, the second-stage MIM structure becomes conductive when the transfer pulse to the first-stage MIM structure has disappeared. Then, charge transfer for the second-stage capacitor $C_B$ is started, and the potential of the first-stage capacitor $C_A$ is raised and set stable at a preset potential (approximately 0) and the potential of the second-stage capacitor $C_B$ is gradually lowered. When the transfer pulse to the second-stage MIM structure has disappeared, the potential $V_B$ thereof is lowered by an amount corresponding to the bias voltage.

At this time, since a transfer pulse for the third-stage MIM structure is applied, the third-stage MIM structure becomes conductive. As a result, charge transfer from the second-stage capacitor $C_B$ to the third-stage capacitor $C_C$ is started, and the signal charge corresponding to the input pulse is stored as a negative potential $V_C$ to the third-stage capacitor $C_C$ as shown by variation in the potentials $V_B$ and $V_C$ when the transfer pulse has disappeared.

In this way, charges corresponding to the signal charge input to the input terminal a are sequentially stored into first- to third-stage capacitors $C_A$ to $C_C$ in this order by applying transfer pulses having different time widths to the first- to third-stage MIM structures, and in this case, the transfer pulses of the first- to third-stage MIM structures are terminated in this order.

Figure 14:
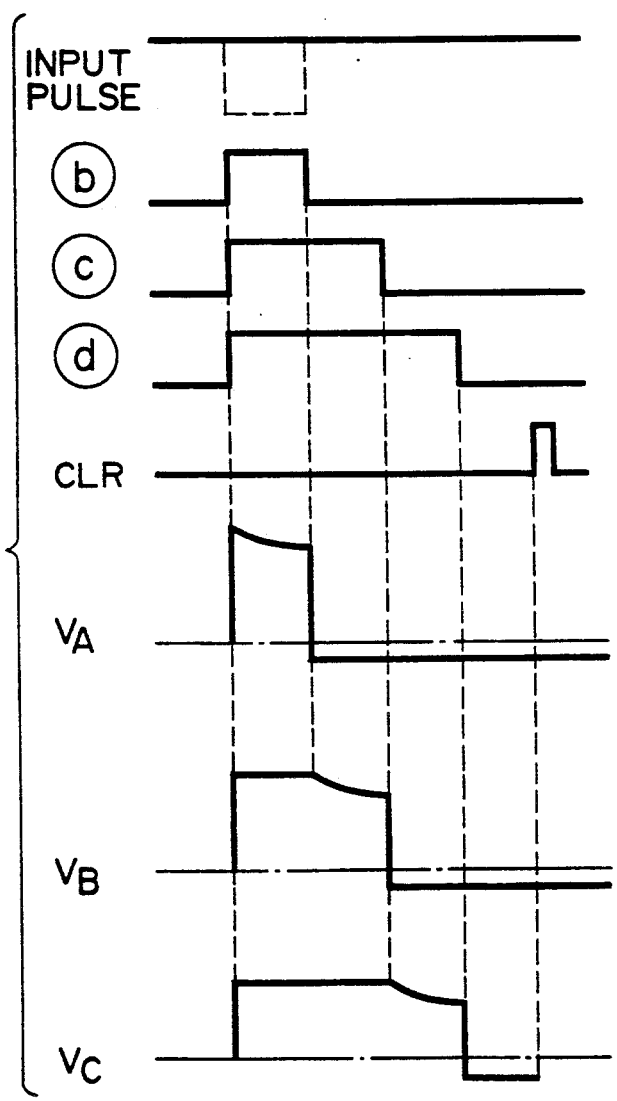

In a case wherein similar transfer pulses are applied to the MIM structures without applying an input pulse, the potentials $V_A$, $V_B$ and $V_C$ thereof vary as shown in FIG. 14. That is, the potentials are raised by application of the transfer pulses but the potentials $V_A$, $V_B$ and $V_C$ are returned to approximately 0 when the transfer pulses have disappeared. This means that the potentials $V_A$, $V_B$ and $V_C$ depend only on application of the transfer pulses and will not vary when the charge transfer and storage operation is effected since there are no charges input by application of the input pulse.

In FIGS. 13 and 14, the potentials $V_A$, $V_B$ and $V_C$ are returned to approximately 0 but not set at 0 when the transfer pulses have disappeared. This error is caused by noise and an error of approx. 10% may be permitted to occur when charges are transferred through several stages (for example, 5 or 6 stages). A certain amount of noise also occurs in the conventional semiconductor CCD memory and the error in the charge transfer device using the MIM structures of this invention can be made negligible by taking the same countermeasure as that used for the conventional CCD.

As is clearly understood from the above experimental result, transfer of charges between a plurality of cascade-connected MIM structures can be controlled with the individual MIM structure used as a unit by the transfer pulse control according to this invention. As a result, it is proved that, as shown in FIGS. 6A to 6D and FIGS. 8A to 8D, an input charge can be sequentially stored into the unit cells formed of a plurality of MIM structures constituting a one-dimensional MIM structure and capacitors starting from the output stage and the stored charges can be sequentially read out from the output stage.

Thus, it becomes possible to store the signal charge into all of the MIM structures constituting the one-dimensional MIM array by effecting the transfer/storage control of the signal charge and read out the signal charge, making it possible to sufficiently enhance the density of stored signal charges.

In the conventional case, since adjacent unit cells are used as a barrier for the charge transfer as is represented by a two-layered clock CCD, only half of the unit cells can be used for storage of the signal charges. In contrast, according to the driving method for the above charge transfer device, the signal charges stored in the plurality of unit cells cannot be simultaneously transferred but the information charge of high density can be stored by using all of the unit cells and a practically significant effect can be obtained at the high density of charges.

The above driving method for the charge transfer device can also be applied to an MIM charge transfer device of vertical structure proposed by the same inventors in U.S. patent application Ser. No. 07/398,271 (EPC Application No. 89115861.0), now U.S. Pat. 4,972,370. That is, as shown in FIG. 15, metal films 21 and tunnel switching films 22 are alternately disposed to form a multi-layered laminated structure, and each tunnel switching film 22 sandwiched between the metal films 21 is used as a unit cell and connected to a capacitor 23. Transfer pulses having time widths which are controlled as described above are applied to the unit cells via the respective capacitors 23. When the charge transfer device of vertical structure is driven in the above described manner, the same effect as in the above embodiment can be obtained, thus making it possible to attain a high density record.

In the above driving method of the charge transfer device, the signal charges are serially stored in a one-dimensional MIM array constituted by a plurality of MIM structures and the capacitors connected thereto and the signal charges are serially read out. However, as described before, in the charge transfer device of this invention, since the signal charges can be serially stored in the respective unit cells constituting the one-dimensional MIM array, it is possible to read out the signal charges stored in the capacitors in parallel by controlling switches $SW_B$, $SW_C$, $SW_D$ and $SW_E$ connected to the capacitors 161, 162, 163 and 164 of the unit cells as shown in FIG. 16. That is, in a case where the signal charges are sequentially stored into the capacitors starting from the rightmost stage of the one-dimensional MIM array, the signal charges are sequentially stored into the capacitors starting from the final-stage capacitor 164 in response to the signal input so that the period in which the signal charges can be read out may be determined as shown in FIG. 17. Therefore, the signal charges serially input and stored into the one-dimensional MIM array can be read out in parallel by controlling the conduction states of the switches $SW_B$, $SW_C$, $SW_D$ and $SW_E$ connected to the capacitors 161, 162, 163 and 164 for readout of the signal charge at timings as shown in FIG. 17. As a result, the signal charges can be easily subjected to a serial-parallel conversion by using the charge transfer device.

The basic element structure of the charge transfer device according to this invention and the charge transferring/storing operation by the driving method have been described above. In the element structure of this invention, a plurality of unit cells are formed as memories by arranging a plurality of MIM structures each constituted by a tunnel switching film sandwiched between metal films on the insulative substrate and connecting capacitors to the MIM structures and the unit cells are laterally arranged and serially connected. A one-dimensional MIM array is provided in which the signal charges are laterally transferred between the plurality of unit cells and the signal charge is sequentially stored in each of the unit cells. It is also explained that the switch for erasing the stored charge is connected to the final-stage capacitor of the one-dimensional array from which the signal charge is read out. With the charge transfer device having the above basic construction, the device can be realized as a semiconductor memory element having at most three-layered structure and thus the manufacturing process thereof can be significantly simplified and the charge transfer device of the one-dimensional MIM array structure of high density can be easily attained. Further, since the driving method for sequentially storing the signal charges into a plurality of unit cells constituting the one-dimensional MIM array is used, the signal charges can be stored in all of the unit cells and the recording density can be sufficiently enhanced.

Figure 18A:
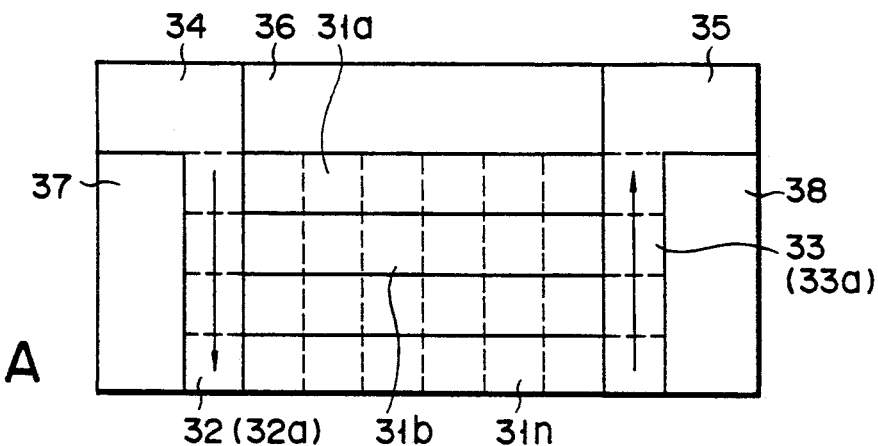
FIGS. 18A and 18B are diagrams respectively showing the constructions of two-dimensional MIM arrays constituted by using one-dimensional MIM arrays.
Figure 18B:
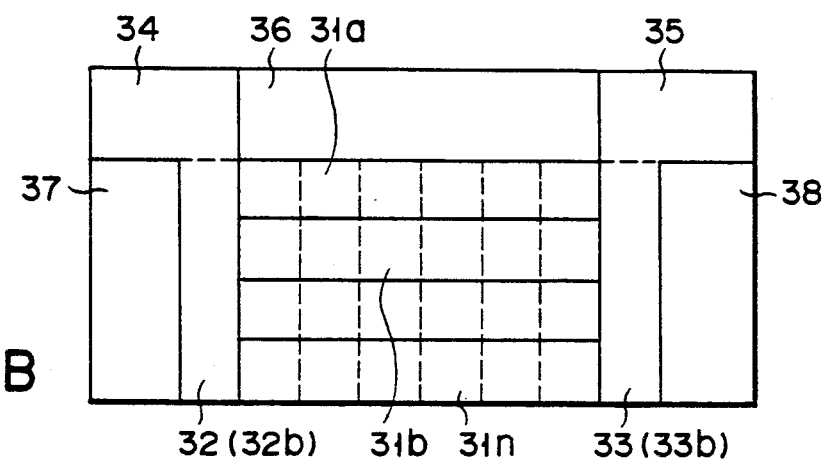

A higher density charge transfer device can be realized by using the above one-dimensional MIM array. FIGS. 18A and 18B are diagrams showing plane constructions of the charge transfer device having a two-dimensional MIM array constituted by arranging the above one-dimensional MIM arrays in parallel. That is, the two-dimensional MIM array is constituted by arranging a plurality of MIM arrays 31a, 31b, ..., and 31n in parallel on the insulative substrate with the charge transfer directions thereof set in the same direction An input element 32 for distributing the signal charges to the one-dimensional MIM arrays 31a, 31b, ..., and 31n is provided on the signal input side of the one-dimensional MIM arrays 31a, 31b, ..., and 31n. Further, an output element 33 for collecting the signal charges read out from the one-dimensional MIM arrays 31a, 31b, ..., and 31n and outputting the collected signal charges is provided on the signal output side of the one-dimensional MIM arrays 31a, 31b, ..., and 31n. The input element 32 and output element 33 may be constituted by one-dimensional MIM arrays 32a and 33a for subjecting the signal charge to a serial-parallel conversion and inputting/outputting the same as shown in FIG. 18A or a demultiplexer 32b and a multiplexer 33b as shown in FIG. 18B.

In FIGS. 18A and 18B, a reference numeral 34 denotes a signal charge inputting interface section, and 35 denotes a signal charge outputting interface section. A reference numeral 36 denotes a driving section for the MIM arrays 31a, 31b, ..., and 31n, 37 denotes a driving section for the input element 32, and 38 denotes a driving section for the output element 33.

The charge transfer device constituted by arranging the plurality of one-dimensional MIM arrays 31a, 31b, ..., and 31n in a plane distributes the signal charge input via the signal charge inputting interface section 34 to the two-dimensional MIM array, or a plurality of one-dimensional MIM arrays 31a, 31b, ..., and 31n via the input element 32 (one-dimensional MIM array 32a or demultiplexer 32b). Then, in the one-dimensional MIM arrays 31a, 31b, ..., and 31n, the transfer/storage of the signal charge is controlled so as to sequentially store the signal charges distributed thereto starting from the unit cell of final stage.

As a result, the signal charges can be stored into the unit cells respectively constituting the one-dimensional MIM arrays 31a, 31b, ..., and 31n in a two-dimensional plane, thus making it possible to significantly enhance the storage recording density. That is, it becomes possible to constitute a two-dimensional MIM array by extending the one-dimensional MIM arrays so as to record the signal charges in a plane at a high density.

When the signal charges stored in the one-dimensional MIM arrays 31a, 31b, ..., and 31n are read out, the signal charge stored in the final stage of the one-dimensional MIM arrays 31a, 31b, ..., and 31n is read out to the output element 33 (one-dimensional MIM array 33a or multiplexer 33b) and then serially output from the signal charge outputting interface section 35 by effecting the transfer control. After this, the next signal charge is read out from the one-dimensional MIM arrays 31a, 31b, ..., and 31n to the output element 33 and then serially transferred and output. The same transfer control operation is repeatedly effected.

Figure 19:
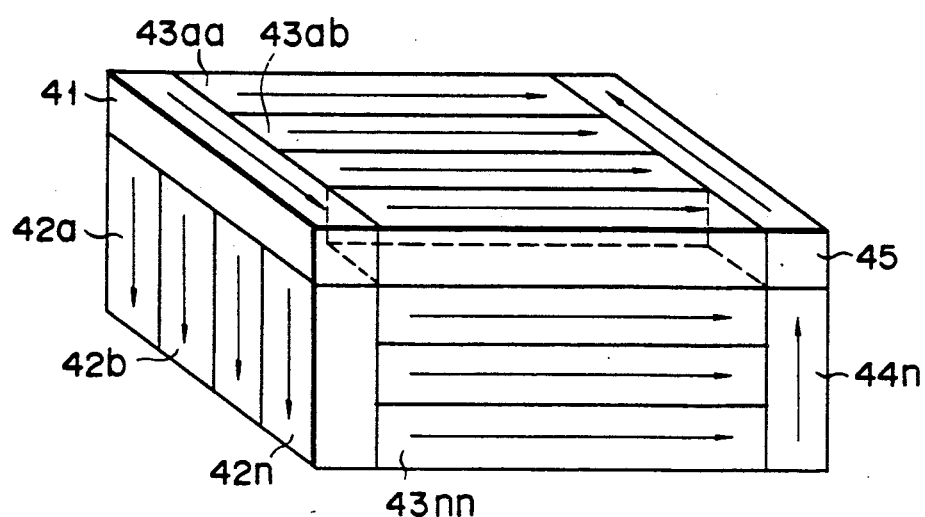
FIG. 19 is a diagram showing the construction of a three-dimensional MIM array constructed by using one-dimensional MIM arrays.

Further, it is possible to constitute a three-dimensional structure by laminating the two-dimensional MIM arrays, which are each constituted by arranging the one-dimensional MIM arrays in a lateral direction in a plane as described above, in a thickness direction thereof as schematically shown in FIG. 19. In a case where the one-dimensional MIM arrays are arranged into a three-dimensional structure, a one-dimensional MIM array 41 for transferring input signal charges in one direction and distributing the same in parallel and a plurality of one-dimensional MIM arrays 42a, 42b, ..., and 42n for transferring the distributed outputs from the one-dimensional MIM array 41 in a vertical direction are provided in the signal input section. The signal charges can be distributed to a plurality of one-dimensional MIM arrays 43aa, 43ab, ..., and 43nn which are arranged in a three-dimensional configuration via the one-dimensional MIM arrays 42a, 42b, ..., and 42n. As described before with reference to the basic structure of the one-dimensional MIM array, the operation of transferring and storing the signal charges in the one-dimensional MIM arrays 43aa, 43ab, ..., and 43nn is effected such that the signal charges can be stored in an order starting from the final-stage unit cell. When the signal charges stored in the one-dimensional MIM arrays 43aa, 43ab, ..., and 43nn are read out, the signal charges read out from the one-dimensional MIM arrays 43aa, 43ab, ..., and 43nn are transferred in a vertical direction via a plurality of one-dimensional MIM arrays 44a, 44b, ..., and 44n and supplied to a one-dimensional MIM array 45. In this way, the signal charges are output in a time sequential manner (serially).

As is clearly understood from the element structure schematically shown in FIG. 19, a plurality of one-dimensional MIM arrays are arranged in a plane to construct a two-dimensional MIM array, and a plurality of two-dimensional MIM arrays are laminated in a thickness direction thereof to construct an MIM array of three-dimensional structure so that the recording density of information charges can be significantly increased and a charge transfer device of extremely high density can be realized.

Thus, according to this invention, a charge transfer device which permits signal charges to be recorded at a high density can be easily realized by forming a basic unit by a one-dimensional MIM array constituted by arranging MIM structures in a lateral direction on the insulative substrate to transfer the signal charges in a lateral direction. Further, since the layer structure of the one-dimensional MIM array which is a basic structure may be basically a three-layered structure, the manufacturing process can be simplified and the device can be easily formed to have a higher density. Therefore, it may produce a significant effect as a memory element for transferring and storing signal charges in practice.

This invention is not limited to the above embodiment. For example, the number (the number of unit cells) of MIM structures constituting the one-dimensional MIM array can be determined according to its application and the number is not limited to a specified value. Further, a method for realizing the MIM structure and the constituting material thereof may be selected from those used in the prior art. Also, a voltage of the transfer pulse and the time width thereof in the driving method may be determined according to the application thereof and the timing control is not limited to a specified one. In the above embodiment, the signal charge is transferred and stored in a digital manner but this invention can be applied to a case wherein the signal charge is transferred and stored in an analog manner. That is, this invention can be applied irrespective of whether the signal charge is transferred and stored in a digital manner or analog manner.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A charge transfer device comprising:
   a substrate having an insulative surface; and
   a first one-dimensional MIM array formed on the surface of said substrate,
   wherein said first one-dimensional MIM array includes:
   (a) a plurality of MIM structures arranged on a row, each of said MIM structures being formed of a tunnel switching film held between first and second metal films and the first metal film of each of said MIM structures being electrically connected to the second metal film of a next stage MIM structure which is adjacent to the former MIM structure; and
   (b) capacitors respectively connected to said first metal films of said respective MIM structures.

2. The device according to claim 1, further comprising:
   at least one second one-dimensional MIM array arranged in parallel with said first one-dimensional MIM array, said second one-dimensional MIM array having the same structure as said first one-dimensional MIM array and said first and second one-dimensional MIM arrays being combined to constitute a two-dimensional MIM array;
   an input element provided on one of opposite ends of said first and second one-dimensional MIM arrays; and
   an output element provided on the other end of said first and second one-dimensional MIM arrays.

3. The device according to claim 2, wherein said input element includes a demultiplexer for distributing signal charges to said first and second one-dimensional MIM arrays.

4. The device according to claim 2, wherein said input element includes a third one-dimensional MIM array for distributing signal charges to said first and second one-dimensional MIM arrays, said third one-dimensional MIM array having the same structure as said first one-dimensional MIM array.

5. The device according to claim 2, wherein said output element includes a multiplexer for reading out the signal charges from said first and second one-dimensional MIM array and combining and outputting the same.

6. The device according to claim 2, wherein said output element includes a third one-dimensional MIM array for reading out the signal charges from said first and second one-dimensional MIM array and combining and outputting the same, said third one-dimensional MIM array having the same structure as said first one-dimensional MIM array.

7. The device according to claim 1, further comprising at least one second one-dimensional MIM array arranged in parallel with said first one-dimensional MIM array, said second one-dimensional MIM array having the same construction as said first one-dimensional MIM array and said first and second one-dimensional MIM arrays being combined to constitute a two-dimensional MIM array; and wherein a plurality of said two-dimensional MIM arrays are laminated to constitute a three-dimensional MIM array; and
said charge transfer device further includes:
(a) an input element provided on one end portion of said three-dimensional MIM array; and
(b) an output element provided on the other end portion of said three-dimensional MIM array.

8. The device according to claim 7, wherein said input element includes:
a third one-dimensional MIM array for transferring input signal charges in a first direction and distributing the same in parallel, said third one-dimensional MIM array having the same construction as said first one-dimensional MIM array; and
a plurality of fourth one-dimensional MIM arrays for transferring a plurality of distributed outputs from said third one-dimensional MIM array in a second direction perpendicular to said first direction and outputting the same, said fourth one-dimensional MIM arrays each having the same construction as said first one-dimensional MIM array.

9. The device according to claim 7, wherein said output element includes:
a plurality of third one-dimensional MIM arrays for transferring input signal charges read out from said first and second one-dimensional MIM arrays in a first direction, said third one-dimensional MIM arrays each having the same construction as said first one-dimensional MIM array; and
a fourth one-dimensional MIM array for transferring the signal charges transferred from said plurality of third one-dimensional MIM arrays in a second direction perpendicular to said first direction to output the same on a time series basis, said fourth one-dimensional MIM array having the same construction as said first one-dimensional MIM array.

10. The device according to claim 1, further comprising:
a clear mechanism for clearing charges remaining on the capacitor connected to the MIM structure on the output terminal side of said first one-dimensional MIM array.

11. A method for driving a charge transfer device, wherein the charge transfer device comprises a substrate having an insulative surface; and a one-dimensional MIM array formed on the surface of said substrate, wherein the one-dimensional MIM array includes:
(a) a plurality of MIM structures arranged on a row, each of said MIM structures comprising a tunnel switching film arranged between first and second metal films and the first metal film of each of said MIM structures being electrically connected to the second metal film of a next stage MIM structure which is adjacent to said former MIM structure; and
(b) capacitors respectively connected to said first metal films of said respective MIM structures,
the driving method comprising:
applying a transfer pulse to a plurality of the MIM structures via the capacitors thereof;
storing in the one-dimensional MIM array signal charges which are supplied to the second metal film of a corresponding one of the MIM structures into the capacitor thereof in response to a transfer pulse applied to said MIM structure via said capacitor thereof;
controlling time widths of transfer pulses respectively applied to said plurality of MIM structures constituting said one-dimensional MIM array in order to selectively control said MIM structures for serially transferring the signal charges; and
serially transferring the signal charges between said MIM structures which are applied with the transfer pulses by respectively applying the transfer pulses whose time widths are controlled to said plurality of MIM structures constituting said one-dimensional MIM array.

12. The method according to claim 11, comprising controlling the time widths of said transfer pulses to permit the signal charges supplied from an input terminal of said one-dimensional MIM array to be sequentially stored into said capacitors starting from the capacitor which is connected to the MIM structure provided on the side of an output terminal thereof.

13. The method according to claim 11, comprising controlling the time widths of said transfer pulses to sequentially read out the signal charges from said capacitors starting from the capacitor which is connected to the MIM structure provided on the side of an output terminal of said one-dimensional MIM array.

14. A method for driving a charge transfer device, wherein the charge transfer device comprises a substrate having an insulative surface; and a one-dimensional MIM array formed on the surface of said substrate, wherein the one-dimensional MIM array includes:
(a) a plurality of multi-layered MIM structures arranged on a row, each of said MIM structures comprising a plurality of metal films and a plurality of tunnel switching films alternately laminated on each other, a tunnel switching film arranged between adjacent metal films serving as a basic unit; and
(b) capacitors respectively connected to said metal films of said respective MIM structures,
said method comprising:
sequentially storing signal charges supplied from an input terminal of said one-dimensional MIM array into said capacitors starting from the capacitor which is connected to the MIM structure provided on an output terminal side thereof; and
sequentially reading out signal charges from said capacitors starting from the capacitor which is connected to the MIM structure provided on the output terminal side of said one-dimensional MIM array.

* * * * *